（12）United States Patent
Dezelah et al.

(10) Patent No.: US 12,550,642 B2
(45) Date of Patent: Feb. 10, 2026

(54) DEPOSITION OF BORON NITRIDE FILMS USING HYDRAZIDO-BASED PRECURSORS

(71) Applicant: ASM IP Holding, B.V., Almere (NL)

(72) Inventors: Charles Dezelah, Helsinki (FI); Timothee Blanquart, Oud-Heverlee (BE)

(73) Assignee: ASM IP Holding, B.V., Almer (NL)

( * ) Notice: Subject to any disclaimer, the term of this patent is extended or adjusted under 35 U.S.C. 154(b) by 832 days.

(21) Appl. No.: 17/818,081

(22) Filed: Aug. 8, 2022

(65) Prior Publication Data

US 2023/0098689 A1 Mar. 30, 2023

Related U.S. Application Data

(60) Provisional application No. 63/233,080, filed on Aug. 13, 2021.

(51) Int. Cl.
H01L 21/02 (2006.01)
C23C 16/34 (2006.01)
C23C 16/455 (2006.01)
C23C 16/56 (2006.01)

(52) U.S. Cl.
CPC ...... H01L 21/02205 (2013.01); C23C 16/342 (2013.01); C23C 16/45553 (2013.01); C23C 16/56 (2013.01); H01L 21/02175 (2013.01); H01L 21/0228 (2013.01)

(58) Field of Classification Search
CPC ......... H01L 21/02205; H01L 21/02175; H01L 21/0228; H01L 21/02425; H01L 21/0254; H01L 21/02592; H01L 21/0262; H01L 21/76834; H01L 21/0332; H01L 21/76801; H01L 21/02112; C23C 16/342; C23C 16/45553; C23C 16/56; C23C 16/45523
See application file for complete search history.

(56) References Cited

U.S. PATENT DOCUMENTS

2009/0286402 A1* 11/2009 Xia ............... H01L 21/318 257/E21.249
2012/0178266 A1* 7/2012 Heys ............... C23C 16/448 438/785
2017/0022612 A1 1/2017 Lei et al.

FOREIGN PATENT DOCUMENTS

CN 108910843 A 11/2018

* cited by examiner

Primary Examiner — Michael G Miller
(74) Attorney, Agent, or Firm — Banner & Witcoff, Ltd.

(57) ABSTRACT

A method of forming high quality a-BN layers. The method includes use of a precursor chemistry that is particularly suited for use in a cyclical deposition process such as in chemical vapor deposition (CVD), atomic layer deposition (ALD), and the like. In brief, new methods are described of forming boron nitride (BN) layers from precursors capable of growing amorphous BN (a-BN) films by CVD, ALD, or the like. In some cases, the precursor is or includes a borane adduct of hydrazine or a hydrazine derivative.

21 Claims, 3 Drawing Sheets

DEPOSITION OF BORON NITRIDE FILMS USING HYDRAZIDO-BASED PRECURSORS

CROSS REFERENCE TO RELATED APPLICATIONS

This Application claims the benefit of U.S. Provisional Application 63/233,080 filed on Aug. 13, 2021. The entire contents of this application is incorporated herein by reference in its entirety.

FIELD OF THE DISCLOSURE

The present disclosure relates generally to methods suitable for forming electronic devices. More particularly, the disclosure relates to methods that include forming a layer including boron nitride for use, for example, as an etch stop layer or a low-k dielectric.

BACKGROUND OF THE DISCLOSURE

In semiconductor manufacturing, a low-k can refer to a material with a low dielectric constant (k (or, more formally, kappa)) relative to silicon dioxide. Low-k dielectric material implementation is one of several strategies used to allow the continued scaling of microelectronic devices downward in size. In digital circuits such as CMOS devices, for example, insulating dielectrics separate the conducting parts (wire interconnects and transistors) from one another. As components have scaled downward in size and transistors have gotten closer together, the insulating dielectrics have thinned to the point where charge build up and crosstalk adversely affect the performance of the device.

Replacing the silicon dioxide with a low-k dielectric can reduce parasitic capacitance, enabling faster switching speeds and lower heat dissipation. There are many materials with lower relative dielectric constants but few of them can be suitably integrated into a manufacturing process. Development efforts have focused primarily on the following classes of materials: fluorine-doped silicon dioxide; organosilicate glass; porous silicon dioxide; and spin-on organic and silicon-based polymeric dielectrics.

While providing advantages over the use of silicon dioxide, these low-k dielectric materials have not met all needs of the semiconductor industry. More recently, the industry has begun work toward use of materials with an ultra-low dielectric constant (or ultra-low k, where k<2) to try to meet demands for continued scaling of electronic devices downward in size.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

The inventors recognized that amorphous boron nitride (a-BN) has been identified as a material with the potential to provide an ultra-low dielectric constant (ultra-low k, where k<2). Such ultra-low k materials are expected to find applications as etch stop layers or interlayer dielectrics or intermetal dielectrics (e.g., as a low-k dielectric) for future logic, memory, and other integrated circuits, due to their ability to help reduce parasitic capacitance and crosstalk while also providing good electrical, thermal, and mechanical stability. Prior to the present description, though, vapor phase methods for delivering BN films have been limited in part because they have not provided the amorphous phase of material and have typically not give optimally low k values (e.g., ultra-low dielectric constant values).

In response to these and other challenges, a new precursor chemistry is described herein to provide higher quality a-BN layers, and the precursor chemistry is particularly suited for use in a cyclical deposition process such as in chemical vapor deposition (CVD), atomic layer deposition (ALD), and the like to provide an etch stop layer, a low-k dielectric, or other desired layer. In brief, the inventors have created new methods of forming boron nitride layers from precursors capable of growing amorphous BN (a-BN) films by CVD, ALD, or the like. In some cases, the precursor may include a borane adduct of hydrazine or a hydrazine derivative or may include hydrazido boranes.

Disclosed herein, according to various embodiments, is a method of forming a layer comprising amorphous boron nitride. The method may include providing a substrate within a reaction chamber. Further, the method may include providing a precursor including a borane adduct of hydrazine or of a hydrazine derivative to the reaction chamber and then using the precursor to form an amorphous layer comprising boron nitride.

According to some embodiments of the method, the precursor is represented as:

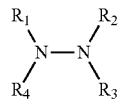

where at least one of $R_1$ to $R_4$ includes BR'R", with R' and R" being independently selected from the group consisting of H, an alkyl group, and an aryl group. In such cases, one to three of $R_1$ to $R_4$ may be independently selected hydrocarbon functional groups, and at least one of the hydrocarbon functional groups may include a C1 to C10 alkyl. In various embodiments of the method, at least one of the hydrocarbon functional groups may include a C6 to C10 aryl.

In these or other embodiments of the method, at least one of $R_1$ to $R_4$ is selected from the group consisting of: an alkyl group, an aryl group, a hydrazine, a hydrazine-derived group, a halogen, hydrogen (e.g., $BH_2$, BHR, or the like attached to hydrazine), and zwitterionic variants (e.g., $R_2NNR_2BR_3$, where both N and B have four bonds and have + and − formal charges, respectively). The forming of the dielectric layer may include a cyclical deposition process including a plurality of cycles, where each of the cycles comprises a precursor pulse and a reactant pulse, where the precursor pulse comprises exposing the substrate or the layer deposited thereon to the precursor, and where the reactant pulse comprises exposing the substrate or the layer deposited thereon to a reactant. In these and other implementations of the method, the amorphous boron nitride preferably may have a dielectric constant of less than two.

According to other various other embodiments, a method is described for fabricating a structure, and this method includes forming a first layer on a substrate. Then, after the depositing of the first layer is completed, the method includes forming an etch stop layer or a dielectric layer on the first layer by performing a deposition process including a plurality of cycles. Each of the cycles may include a precursor pulse and a reactant pulse, where the precursor pulse includes exposing the first layer of the conductive material to a precursor and where the reactant pulse includes exposing the first layer of the conductive material to a reactant. In these embodiments of the method, the precursor may include a borane adduct of hydrazine or of a hydrazine derivative or may include a hydrazido borane In the borane adduct, there is a coordinate covalent bond between one N atom of $R_2NNR_2$ and the B atom of $BR_3$. In a hydrazido borane, one of the R groups on N is $BR_2$.

In other embodiments, a method is described of fabricating a structure, and the method includes providing a substrate and then depositing a first layer on the substrate. The method further includes, after the depositing of the first layer, forming an ultra-low k dielectric layer comprising boron nitride on the first layer. Additionally, the method may include, after the forming of the ultra-low k dielectric layer, depositing a second layer over the dielectric layer, whereby the dielectric layer is sandwiched between the first and second layers. In some preferred embodiments, the step of forming of the ultra-low k dielectric layer includes exposing a surface of the first layer to a precursor including a borane adduct of hydrazine or of a hydrazine derivative or including a hydrazido borane.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein. Additionally, the step of forming a dielectric layer on the substrate may include depositing a thin film of the amorphous boron nitride using chemical vapor deposition (CVD), atomic layer deposition (ALD), or the like.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
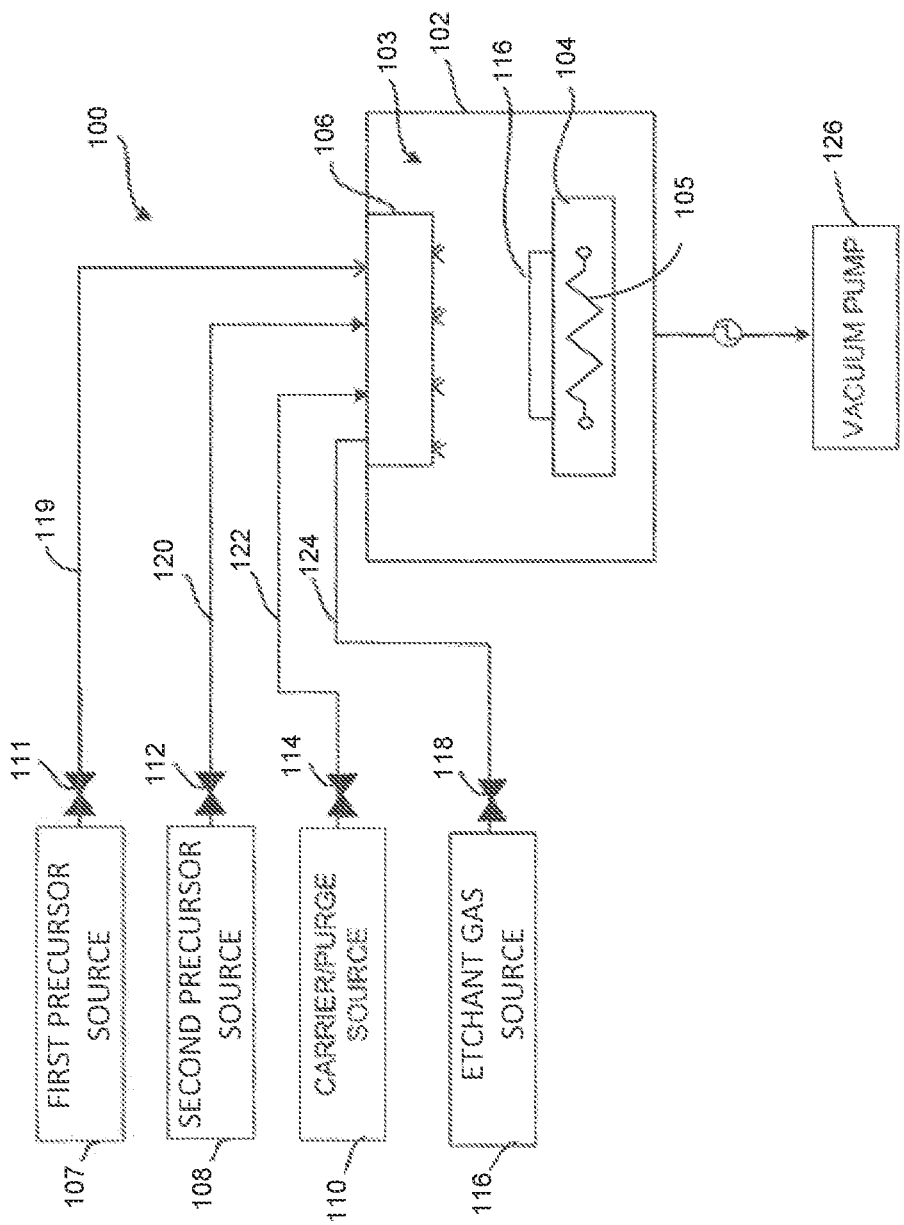
FIG. 1 illustrates an exemplary semiconductor processing apparatus or system in accordance with various exemplary embodiments of the present description.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition and the like when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous. As described in greater detail below, various details and embodiments of the disclosure may be utilized in conjunction with a reaction chamber configured for a multitude of deposition processes, including but not limited to, ALD, CVD, cyclical CVD plasma-enhanced chemical vapor deposition (PECVD), and the like. The embodiments of the disclosure may also be utilized in semiconductor processing systems configured for depositing (providing or forming) layers or thin films.

The inventors recognized that there continues to be a need for amorphous boron nitride (a-BN) deposition processes to provide this material as a layer or film with an ultra-low dielectric constant (k<2) in CMOS and other semiconductor devices. The new deposition method may take the form of a cyclical deposition process including a plurality of cycles (such as, for example, ALD, cyclic CVD, or the like) that make use of one or more precursors selected specifically to provide BN film or layer in a stack or semiconductor device.

The precursors taught herein are in a class of precursors capable of growing amorphous BN films by CVD, ALD, and CVD or ALD-like cyclical deposition processes. In general, the precursors include a borane adduct of hydrazine or of a hydrazine derivative. Hydrazine derivatives that may be useful in the new deposition method include those containing between one and four hydrocarbon substituents. In some implementations of the deposition method, the substituents independently include at least one borane derivative and one or more C1 to C10 alkyl, and/or one or more C6 to C10 aryl groups, and/or hydrogen. Substituents on the borane derivative may also be independently selected from hydrogen, an alkyl, an aryl group, hydrazine, hydrazine-derived groups, and a halogen. This class of precursors, under suitable CVD, ALD, or other deposition processes, are used to deposit low k and, more preferably, ultra-low k boron nitride films, either with or without co-reactants or using a plasma-generated co-reactant species.

FIG. 1 illustrates a semiconductor processing apparatus or system 100 suitable for use in depositing a thin film/layer of a-BN in accordance with examples of the disclosure. The apparatus 100 may include a reactor 102, which may further include a reaction chamber 103, a substrate holder 104, and a gas distribution system 106. The apparatus 100 may also include a precursor delivery system that includes a first precursor source 107, a second precursor or a reactant source 108 (which may be optional in some embodiments of system 100), and a carrier or purge gas source 110. The apparatus 100 may further include valves 111, 112, 114, and 118, which are selectively operable by a system controller 101 (understood by those skilled in the art as running control software with a processor(s) to perform a deposition process described herein by providing the precursors, purge gas, and optionally a reactant to the reaction chamber 103 via system 106), interposed between the sources 107, 108, 110, and 116 and the reactor 102.

Reaction chamber 103 may be a standalone reaction chamber or be part of a cluster tool. The reaction chamber 103 may include a reaction chamber typically used for CVD, ALD, or the like and may include direct plasma and/or remote plasma apparatus. The reaction chamber may operate under a vacuum or near atmospheric pressure. By way of one example, reaction chamber 103 may include a reaction chamber suitable or ALD deposition of a film by sequentially pulsing the first precursor from source 107 and, optionally, the second precursor/reactant from source 108 onto at least one substrate 116 to form an a-BN film, which may serve as an etch stop or dielectric layer. Substrate holder 104 may be configured to hold at least one substrate, such as substrate 116 that may have one or more layers or films disposed thereon, in place during processing. In accordance with various exemplary embodiments, the substrate holder or susceptor 104 may form part of a direct plasma circuit. Additionally or alternatively, the substrate holder 104 may be heated (e.g., by heating element 105), cooled, or be at ambient process temperature during processing. In some embodiments, heating element 105 may be configured to perform an annealing step on the at least one substrate 116.

In further embodiments, heating element 105 may be operatively coupled to controller 101.

Although gas distribution system 106 is illustrated in block form, the gas distribution system 106 may be relatively complex and designed to mix vapor (gas) from first precursor source 107, second precursor source 108, carrier/purge gas from gas source 110, and/or etchant gas source 116 prior to distributing the gas mixture to the remainder of the reaction chamber 103. Further, gas distribution system 106 may be configured to provide vertical (as illustrated) or horizontal flow of gases to the surface of substrate 116.

First precursor source 107 may be a liquid, solid, or gas source of material suitable in a film deposition process for depositing or growing an ultra-low k BN film and, more preferably an amorphous BN (or a-BN) film, on a substrate or on a previously-deposited film (e.g., a film or layer of conductive material as may be useful in a CMOS or other semiconductor device). If first precursor source 107 is liquid or solid, the source material may be vaporized prior to entering the gas distribution system 106 and chamber 103. In some embodiments of the present description, the precursors include a borane adduct of hydrazine or of a hydrazine derivative.

Expanding on this description, the precursor provided by source 107 may be a hydrazido borane or a borane adduct with hydrazine, which may be represented as $BH_3 \cdot N_2H_4$, or with a hydrazine derivative. In some embodiments, the hydrazine derivative includes a compound with one to four substituents that may be independently selected, which may be represented as $N_2R_4$. In an exemplary implementation of the precursor, each R is a borane derivative, hydrogen, or is a hydrocarbon substituent; the hydrocarbon substituent can be selected from the group consisting of: alkyl groups from C1 to C10 and aryl groups from C6 to C10. In these or other implementations of the precursor, substituents may be provided in the borane, derivative which may be represented as $BR_2$, and each R may be independently selected from the group consisting of: hydrogen; an alkyl group; an aryl group; hydrazine group; a hydrazine-derived group; a halogen; hydrogen (e.g., $BH_2$, BHR, or the like attached to hydrazine); and zwitterionic variants (e.g., $R_2NNR_2BR_3$, where both N and B have four bonds and have + and − formal charges, respectively); $BH_2$ attached to the N atom of a hydrazine, and $BH_3$ attached to the N atom of a hydrazine.

The precursor may be stated in general equation form as:

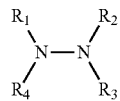

where at least one of $R_1$ to $R_4$=BR'R", where R' and R" are independently selected from the group consisting of H, an alkyl group, and an aryl group. Exemplary alkyl groups being (C1-C10), and exemplary aryl groups being (C6-C10). The remaining $R_1$ to $R_4$ groups can be independently selected from the group consisting of H, BR'R" as described above, and aryl and/or alkyl groups comprising 10 or less carbon atoms.

The following equations provide five specific, but non-limiting examples, of hydrazine borane adducts and derivatives that may be used as the precursor:

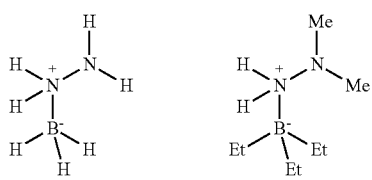

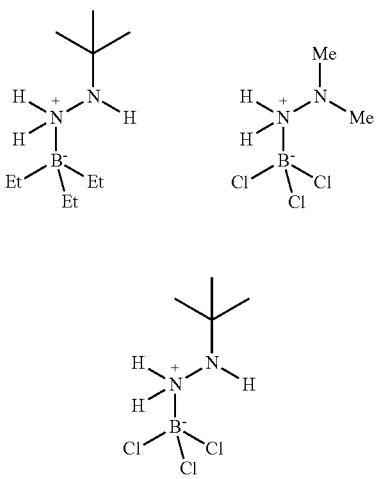

The following equations provide nine specific, but non-limiting examples, of hydrazido boranes (also labeled or known as "borylhydrazines" or "hydrazine boranes") that may be used as the precursor:

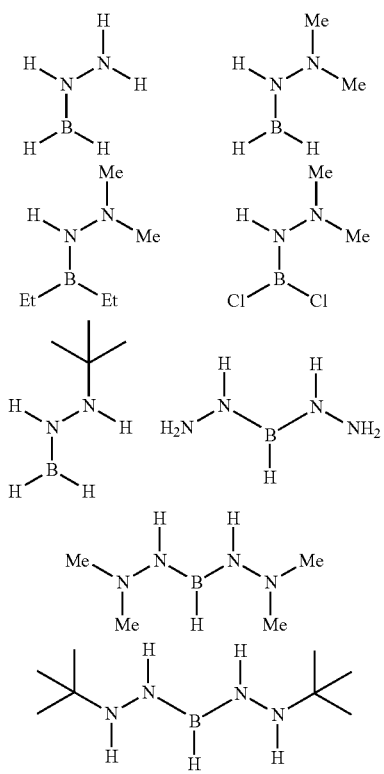

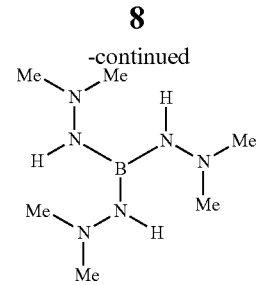

The second precursor source 108 may be configured similarly or differently than the first precursor source 107 and these sources 107 and 108 may be utilized together to deposit the BN film (e.g., by providing a desired co-reactant for the first precursor) or separately to deposit the BN film or the BN film and other layers of a semiconductor stack or device. Since the precursor contains both hydrazine-like and borane-like components, the co-reactant could contain either of these elements, e.g., $NH_3$, $N_2H_4$, $Me_2NNH_2$, $tBuNHNH_2$, $B_2H_6$, $BCl_3$, $BBr_3$, $BEt_3$, $B(NMe_2)_3$, $BH_3(NHMe_2)$, or the like. Additionally, $H_2$ could be used as a co-reactant. Alternatively, plasma-based co-reactants such as $H_2$ plasma, $H_2/N_2$ plasma, $NH_3$ plasma, $H_2/Ar$ plasma, or Ar plasma could be useful. Carrier or purge gas source 110 may include any gas suitable for mixing with the gases from the first and second precursor sources 107 and 108. Carrier or purge gas source 110 may also include any gas suitable for purging the reaction chamber 103 before, after, or during the BN film deposition process. In accordance with exemplary embodiments of the description, a purge gas or a carrier gas may be nitrogen, argon, helium, or a combination thereof.

Figure 2:
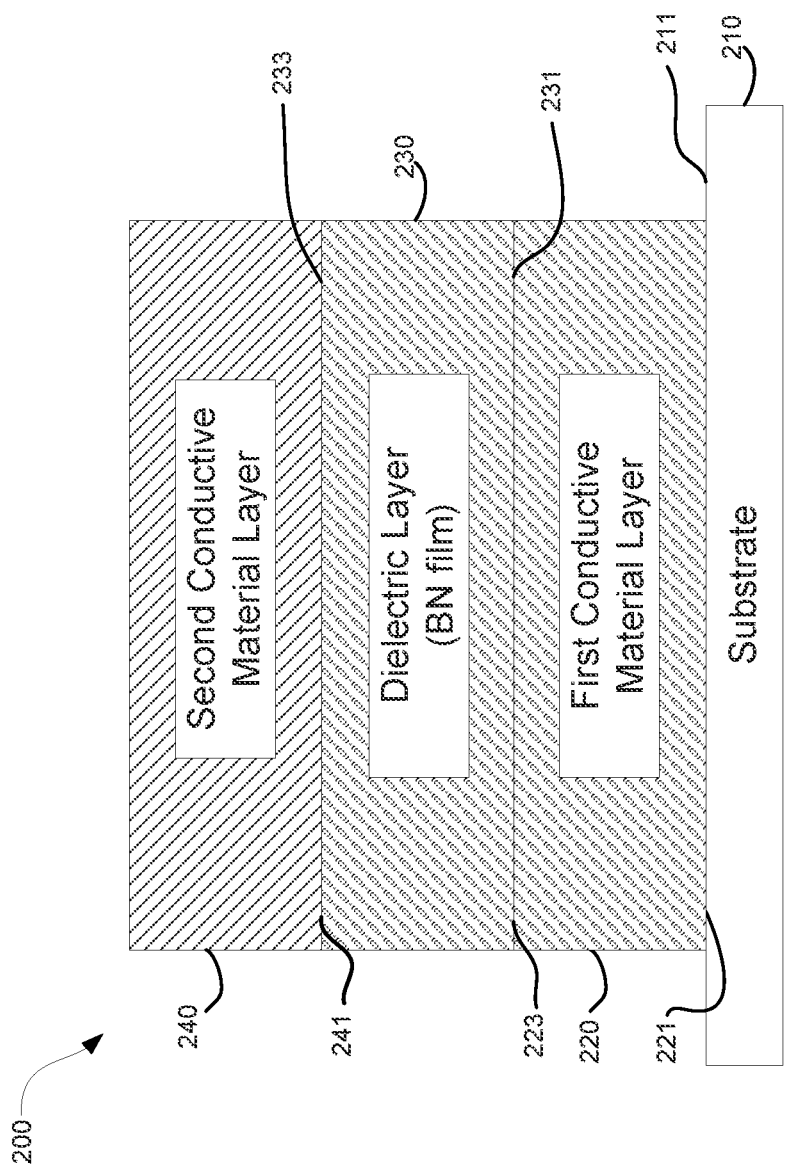
FIG. 2 illustrates a simplified cross-sectional view of an exemplary semiconductor device or stack fabricated in accordance with some embodiments of the present description such as with the method of FIG. 3 to have a boron nitride dielectric layer.
Figure 3:
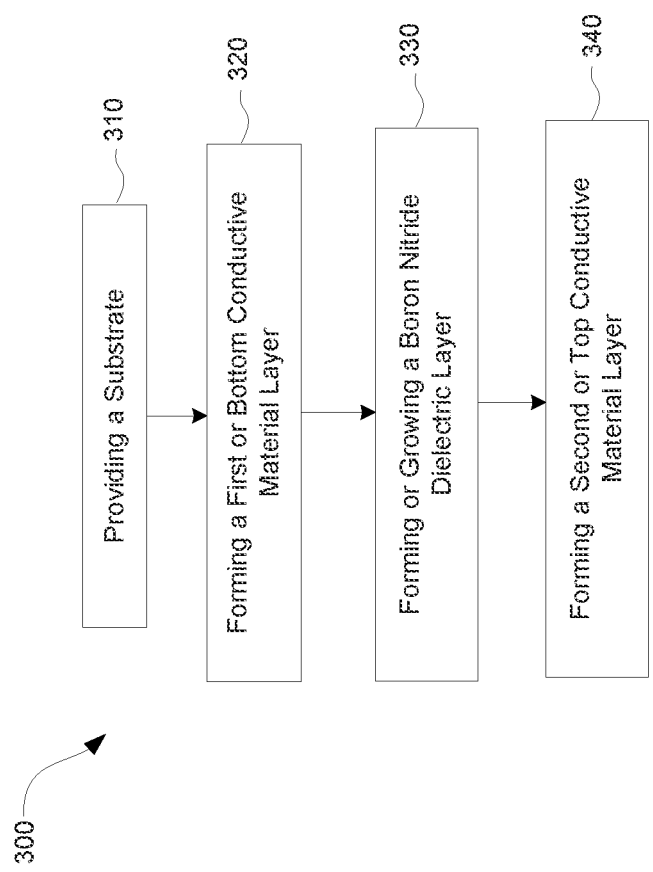
FIG. 3 is a flow diagram of a method of manufacturing or fabricating semiconductor device with a boron nitride dielectric layer of the present description.

FIG. 2 illustrates a simplified cross-sectional view of a stack 300 comprised in an integrated circuit fabricated in accordance with some embodiments of the present description such as with the method 300 of FIG. 3. As shown, a first layer 220 of conductive material is formed above a substrate 210. Using the method 300 of FIG. 3, a conductive material film or layer 220 is deposited upon the upper surface 211 of the substrate 210 such that a lower side or surface 221 of the layer 220 abuts or is in contact with the substrate's upper surface 211. In some embodiments, the first layer 220 is patterned, e.g., to form a plurality of metal lines. For example, the stack 200 may be used in the context of metal interconnects in a logic, memory, or other type of integrated circuit. Alternatively, a substrate can be provided with conductive layer 210 formed thereon.

In a next fabrication step, a layer or film a-BN or low k or, more preferably, an ultra-low k material is deposited to form a dielectric layer (or just "dielectric") 230 over the first conductive material or electrode layer 220 (while other uses of the a-BN layer are an etch stop layer). As discussed above with reference to FIG. 1, the dielectric layer or film 230 may be grown or deposited to provide a desired thickness of amorphous boron nitride (a-BN), with a dielectric constant, k, of less than two in some preferred embodiments.

The stack or device 200 further includes a second conductive material or electrode layer 240 that is formed of a thin film or layer of a conductive material, such as a metal, for example Cu, Co, Al, Mo, W, or an alloy thereof. The electrode 240 can, in some embodiments, be patterned, e.g., to form a plurality of metal lines. In some embodiments, the dielectric layer 230 can be patterned to form a plurality of through holes. The through holes can be filled with a conductive material, such as one of the aforementioned metals. Thus, in exemplary embodiments, conductive vias (not shown) can be formed through the dielectric layer 230 to form electrical connections between metal lines formed of the conductive layer 210 and the conductive layer 230. The electrode layer 360 may be formed of the same metal or material as that of the first electrode layer 220 or be formed of a differing metal to suit a particular interconnect scheme. The layer 240 is deposited with its lower surface or side 241 abutting or mating with the upper surface or side 233 of the dielectric layer 230, whereby the dielectric layer 230 is sandwiched between the conductive material layers 220 and 240 to provide an interlayer dielectric, an inter-metal dielectric, or the like that reduces parasitic capacitance and cross-talk in the device 200.

In many cases, the a-BN layer (or material) will be used as a low-k material and/or as an etch stop layer such that substrates used are often silicon wafers. The surfaces that a-BN will be deposited upon include silicon, silicon germanium, metals, and dielectrics, which may be in the SiOCN material system such as silicon oxide, silicon carbide, silicon nitride, and mixtures thereof. Typical metals used in mid-end-of-line applications, where the techniques described herein likely will be used, include, but are not limited to: molybdenum, tungsten, titanium nitride, aluminum, copper, and cobalt. When conductive metal layers "sandwiching" the BN layer is described, it should be understood that typically the a-BN layer is not sandwiched between planes of conductive material, but rather the a-BN is used as a dielectric between adjacent metal wires/lines. Particularly, BN is useful in this context because of its low k value which reduces RC delay and cross-talk between the adjacent metal lines. In other cases, though, BN has a different etch rate than the SiOCN materials when exposed to various etchants such that it is also very useful as an etch stop layer. Advantageously, an etch stop layer formed in accordance with the methods disclosed herein does not necessarily need to be removed.

FIG. 3 illustrates a method 300 for forming a layer comprising amorphous boron nitride suitable for, for example, fabricating a part of an integrated circuit. In many likely applications, the a-BN layer will not be used as a front end-of-line material but, instead, as a mid-end-of-line material. Particularly, the a-BN layer often will be used as an etch stop layer or as a low-k dielectric. Etch stop layers are blanket layers in which holes are formed to allow metal lines to pass through. Low-k dielectrics are electrically insulating materials that are used between the metal lines that connect different semiconductor components. The examples provided herein of fabrication and structures are, therefore, clearly intended to describe and cover the use of the a-BN layer as an etch stop layer or as a low-k dielectric.

Those skilled in the art will appreciate that each of the layers discussed herein and used in a semiconductor device or stack may be formed using any common formation techniques such as ALD (or ALD-like process or other cyclical deposition process), CVD, or the like that are useful for deposition of thin films or layers of materials described herein. Hence, the method 300 is intended to include any useful process for depositing the layers or thin films of the semiconductor stacks described herein and as shown in FIG. 2.

The initial step 310 involves providing a substrate, which may have already received several processing steps useful in the manufacture of a CMOS device or other electronic device and may take the form of a silicon wafer or other useful substrate material(s). The method 300 then includes, at step 320, forming a first or bottom conductive material or electrode layer above or on an upper surface of the substrate from step 310. The conductive layer or film, which may provide the bottom or first electrode of a semiconductor device, may be formed of a metal, conductive metal oxides, conductive metal silicides, conductive metal nitrides, and combinations thereof. Alternatively, a substrate can be provided with the first or conductive material layer formed thereon.

The next step 330 of method 300 includes forming a dielectric layer or film. This may involve depositing, with CVD, ALD, or another useful deposition technology, a layer or film of boron nitride or, more preferably, amorphous boron nitride over the upper or exposed surface of the conductive material layer or electrode from step 320. In some implementations of the method 300, step 330 (and/or steps 320 and 340) of forming the dielectric layer is completed using a cyclical deposition process including a plurality of cycles (such as, for example, CVD, ALD, an ALD-like process, or the like). Each cycle may include a precursor pulse and a reactant pulse, with the precursor pulse including exposing a substrate (e.g., the layer from step 320) to a precursor while the reactant pulse includes exposing the same substrate to a reactant. Typically, subsequent pulses and subsequent cycles are separated by purges, which are common and optional. In this regard, step 330 may be implemented using super cycle processes, in which a super cycle includes a first cycle and a second cycle and where the first and second cycles employ different precursors and/or reactants.

The precursor (e.g., the precursor used or provided by the precursor pulses in a cyclical deposition process) may be a liquid, solid, or gas source of material suitable in a film deposition process for depositing or growing an ultra-low k BN film and, more preferably an amorphous BN (or a-BN) film, on a substrate or on a previously-deposited film. In some embodiments of the method 300, the precursors used in step 330 include a precursor in one of the forms described above. Step 330 may be carried out at a variety of temperatures (e.g., temperatures in the range of 50 to 400° C.) and pressures (e.g., pressures in the range of 0.05 to 100 Torr).

The method 300 continues with step 340 of forming a second or top conductive material or electrode layer above or on an upper surface of the dielectric from step 330. The material deposited in step 340 (e.g., to form the thin film providing the top or second electrode of a semiconductor device) may be the same or differ from that deposited in step 320 (e.g., to form the first or bottom electrode of a semiconductor device). The method 300 may include additional steps (not shown). For example, in the case of etching one or more of the layers, the layer's material can be etched as usual or as is well known in the arts as part of semiconductor device fabrication.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method of forming a layer comprising amorphous boron nitride, the method comprising:

providing a substrate within a reaction chamber; and providing a precursor comprising a hydrazido borane or a borane adduct of hydrazine or of a hydrazine derivative to the reaction chamber, wherein the precursor is represented as:

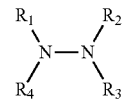

wherein at least one of $R_1$ to $R_4$ comprises BR'R", with R' and R" being independently selected from the group consisting of H, Cl, an alkyl group, and an aryl group; and using the precursor to form an amorphous layer comprising boron nitride.

2. The method of claim 1, wherein at least one of $R_1$ to $R_4$ comprises H, hydrocarbyl, or a hydrazido group.

3. The method of claim 1, wherein one to three of $R_1$ to $R_4$ comprise independently selected hydrocarbon functional groups.

4. The method of claim 3, wherein at least one to three of the hydrocarbon functional groups is a C1 to C10 alkyl.

5. The method of claim 3, wherein at least one of the hydrocarbon functional groups is a C6 to C10 aryl.

6. The method of claim 1, wherein at least one of $R_1$ to $R_4$ is selected from the group consisting of: an alkyl group, an aryl group, a hydrazine, a hydrazine-derived group, a halogen, hydrogen, a zwitterionic variant, $BH_2$, and $BH_3$.

7. The method of claim 1, wherein the forming of a dielectric layer comprises a cyclical deposition process including a plurality of cycles, wherein each of the cycles comprises a precursor pulse and a reactant pulse, wherein the precursor pulse comprises exposing the substrate or the layer deposited thereon to the precursor, and wherein the reactant pulse comprises exposing the substrate or the layer deposited thereon to a reactant.

8. The method of claim 1, wherein the forming of a dielectric layer on the substrate comprises depositing a thin film of the amorphous boron nitride using chemical vapor deposition (CVD) or atomic layer deposition (ALD).

9. The method of claim 1, wherein the amorphous boron nitride has a dielectric constant of less than two.

10. A structure formed according to the method of claim 1.

11. The method of claim 1, wherein the precursor is selected from

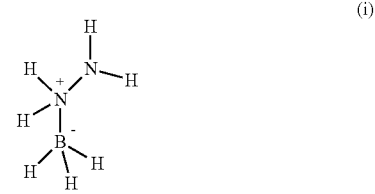

(hydrazine-κN¹)trihydroboron

-continued

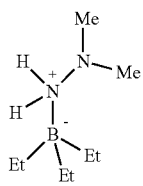

(N¹,N¹-dimethylhydrazine-κN²)triethylboron (ii)

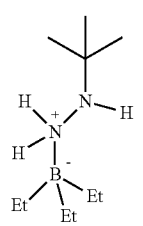

(N¹-tert-butylhydrazine-κN²)triethylboron (iii)

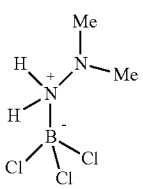

(N¹,N¹-dimethylhydrazine-κN²)trichloroboron (iv)

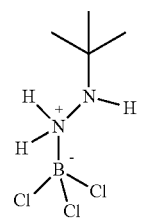

(N¹-tert-butylhydrazine-κN²)trichloroboron (v)

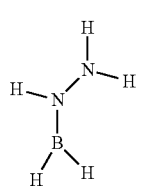

Borylhydrazine (vi)

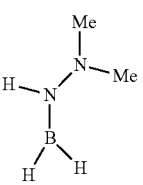

2-boryl-1,1-dimethylhydrazine (vii)

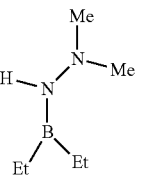

2,2-diethylboryl-1,1-dimethylhydrazine (viii)

-continued

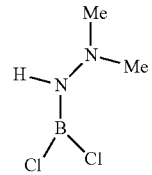

2,2-dichloroboryl-1,1-dimethylhydrazine (ix)

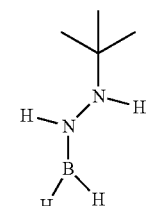

2-boryl-1-tert-butylhydrazine (x)

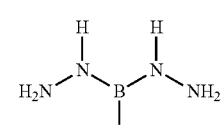

Dihydrazinoborane (xi)

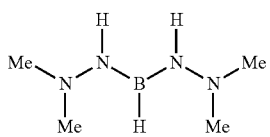

Bis-(2-tert-butylhydrazino)borane (xii)

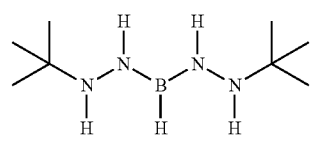

Bis-(2,2-dimethylhydrazino)borane (xiii)

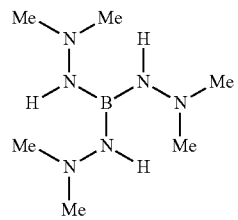

tris(2,2-dimethylhydrazino)borane. (xiv)

12. A method of fabricating a structure, comprising:

forming a first layer of conductive material on a substrate; and after depositing of the first layer, forming an etch stop or a dielectric layer on the first layer by performing a deposition process including a plurality of cycles, wherein each of the cycles comprises a precursor pulse and a reactant pulse, wherein the precursor pulse comprises exposing the first layer of conductive material to a precursor, and wherein the reactant pulse comprises exposing the substrate to a reactant, wherein the precursor comprises a hydrazido borane or a borane adduct of hydrazine or of a hydrazine derivative, and is represented as

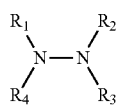

wherein at least one of $R_1$ to $R_4$ comprises BR'R", with R' and R" being independently selected from the group consisting of H, Cl, an alkyl group, and an aryl group.

13. The method of claim 12, wherein the hydrazine derivative comprises one to three independently selected hydrocarbon functional groups.

14. The method of claim 13, wherein at least one of the hydrocarbon functional groups is a C1 to C10 alkyl.

15. The method of claim 13, wherein at least one of the hydrocarbon functional groups is a C6 to C10 aryl.

16. The method of claim 12, wherein at least one of $R_1$ to $R_4$ is selected from the group consisting of: an alkyl group, an aryl group, a hydrazine, a hydrazine-derived group, a halogen, hydrogen, $BH_2$, and $BH_3$.

17. The method of claim 12, wherein the deposition process comprises cyclical chemical vapor deposition (CVD) or atomic layer deposition (ALD).

18. The method of claim 12, wherein the precursor is selected from

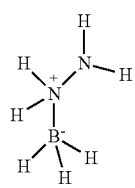 (i)

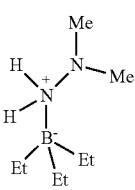 (ii)

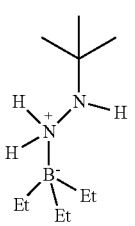 (iii)

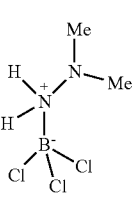 (iv)

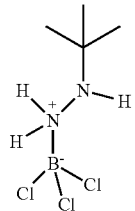 (v)

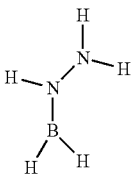 (vi)

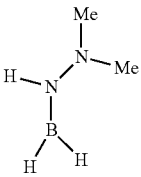 (vii)

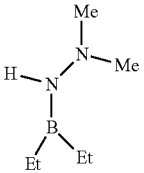 (viii)

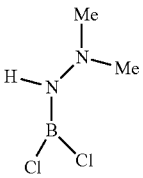 (ix)

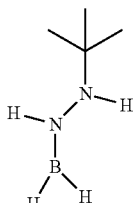 (x)

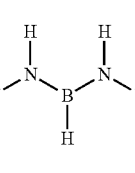 (xi)

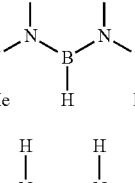 (xii)

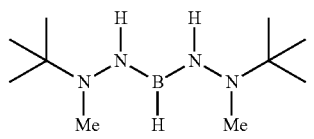 (xiii)

-continued

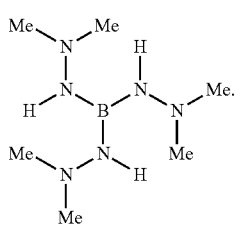
(xiv)

19. A method of fabricating a structure, comprising:
providing a substrate;
depositing a first layer on the substrate;
after the depositing of the first layer, forming an ultra-low k dielectric layer comprising boron nitride on the first layer, wherein the forming of the ultra-low k dielectric layer comprises exposing a surface of the first layer to a precursor comprising a hydrazido borane or a borane adduct of hydrazine or of a hydrazine derivative, wherein the precursor is represented as:

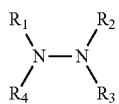

wherein at least one of $R_1$ to $R_4$ comprises BR'R", with R' and R" being independently selected from the group consisting of H, Cl, an alkyl group, and an aryl group; and
after the forming of the ultra-low k dielectric layer, depositing a second layer over the dielectric layer, whereby the ultra-low k dielectric layer is sandwiched between the first and second layers.

20. The method of claim 19, wherein the ultra-low k dielectric layer comprising boron nitride has a dielectric constant of less than two.

21. The method of claim 19, wherein the precursor is selected from

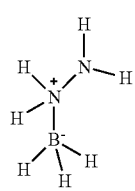
(i)

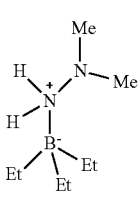
(ii)

-continued

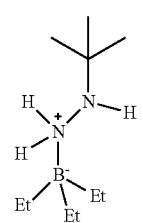
(iii)

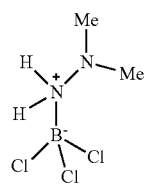
(iv)

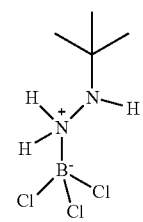
(v)

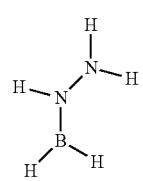
(vi)

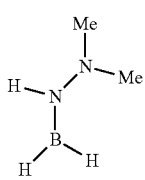
(vii)

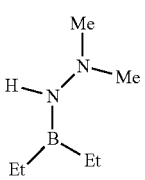
(viii)

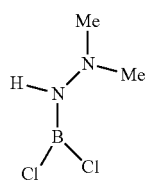
(ix)

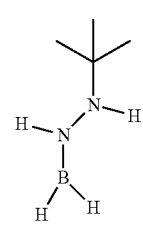
(x)

-continued
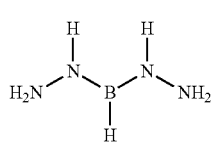
(xi)
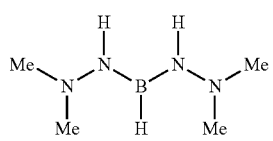
(xii)
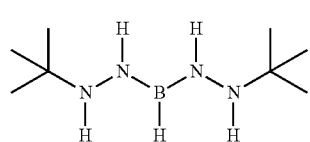
(xiii)
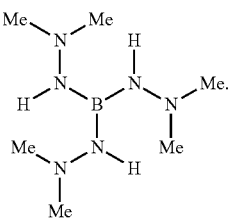
(xiv)
* * * * *